(12) United States Patent
Persson et al.

(10) Patent No.: US 11,310,947 B2
(45) Date of Patent: Apr. 19, 2022

(54) CAMERA MODULE FOR A MOTOR VEHICLE, METHOD OF USING, AND METHOD OF ASSEMBLING A CAMERA MODULE

(71) Applicant: VEONEER SWEDEN AB, Vargarda (SE)

(72) Inventors: Madeleine Persson, Linköping (SE); Peter Fredriksson, Linköping (SE); Filip Törnqvist, Åtvidaberg (SE)

(73) Assignee: VEONEER SWEDEN AB, Vargarda (SE)

( * ) Notice: Subject to any disclaimer, the term of this patent is extended or adjusted under 35 U.S.C. 154(b) by 64 days.

(21) Appl. No.: 16/617,263

(22) PCT Filed: May 29, 2018

(86) PCT No.: PCT/EP2018/064074
§ 371 (c)(1),
(2) Date: Nov. 26, 2019

(87) PCT Pub. No.: WO2018/219951
PCT Pub. Date: Dec. 6, 2018

(65) Prior Publication Data
US 2021/0127532 A1    Apr. 29, 2021

(30) Foreign Application Priority Data

May 30, 2017 (EP) .................................... 17173379

(51) Int. Cl.
*H05K 9/00* (2006.01)
*B60R 16/023* (2006.01)
(Continued)

(52) U.S. Cl.
CPC ......... *H05K 9/0049* (2013.01); *B60R 16/023* (2013.01); *B60R 16/03* (2013.01);
(Continued)

(58) Field of Classification Search
CPC .... H05K 9/0049; B60R 16/023; B60R 16/03; H04N 5/2252; H04N 5/2257; H04N 7/18
(Continued)

(56) References Cited

U.S. PATENT DOCUMENTS 6,947,071 B2   9/2005   Eichmann
7,095,626 B2   8/2006   Seidler
(Continued)

FOREIGN PATENT DOCUMENTS

JP    2011259101 A    12/2011
JP    2013042359 A     2/2013
(Continued)

OTHER PUBLICATIONS

International Search Report and Written Opinion of PCT/EP2018/064074 dated Aug. 1, 2018.

*Primary Examiner* — Joseph G Ustaris
*Assistant Examiner* — Matthew David Kim
(74) *Attorney, Agent, or Firm* — Dickinson Wright PLLC (57) ABSTRACT

A camera module (1) for a motor vehicle, in particular for driver monitoring in the passenger compartment, including at least one printed circuit board (2) and a shield for enclosing the printed circuit board (2). The shield includes at least a first shielding part (7) and a second shielding part (10). The first shielding part (7) is a ring shaped part and the second shielding part (10) is a hat shaped part put over, enclosing, and contacting the first shielding part (7).

15 Claims, 7 Drawing Sheets

(51) Int. Cl.
  *B60R 16/03* (2006.01)
  *H04N 5/225* (2006.01)
  *H04N 7/18* (2006.01)

(52) U.S. Cl.
  CPC ......... *H04N 5/2252* (2013.01); *H04N 5/2257* (2013.01); *H04N 7/18* (2013.01)

(58) Field of Classification Search
  USPC .......................................................... 348/148
  See application file for complete search history.

(56) References Cited

U.S. PATENT DOCUMENTS

| | | | |
|---|---|---|---|
| 8,681,220 B2 | 3/2014 | Maekawa et al. | |
| 8,970,700 B2 | 3/2015 | Inoue et al. | |
| 9,369,613 B2 | 6/2016 | Maekawa et al. | |
| 9,813,665 B2 | 11/2017 | Maekawa et al. | |
| 10,277,863 B2 | 4/2019 | Maekawa et al. | |
| 2004/0090525 A1* | 5/2004 | Eichmann | G08B 13/19647 348/148 |
| 2004/0240192 A1* | 12/2004 | Seidler | H05K 9/0026 361/816 |
| 2008/0014797 A1* | 1/2008 | Yang | H01R 13/6582 439/607.01 |
| 2011/0025850 A1* | 2/2011 | Maekawa | H04N 7/183 348/148 |
| 2011/0298925 A1 | 12/2011 | Inoue et al. | |
| 2014/0146227 A1 | 5/2014 | Maekawa et al. | |
| 2016/0286162 A1 | 9/2016 | Maekawa et al. | |
| 2016/0344912 A1* | 11/2016 | Baik | H04N 5/2254 |
| 2018/0048857 A1 | 2/2018 | Maekawa et al. | |

FOREIGN PATENT DOCUMENTS

| | | |
|---|---|---|
| WO | WO 2004/107374 A2 | 12/2004 |
| WO | WO 2012/123811 A2 | 9/2012 |
| WO | WO 2013/002897 A2 | 1/2013 |

* cited by examiner

CAMERA MODULE FOR A MOTOR VEHICLE, METHOD OF USING, AND METHOD OF ASSEMBLING A CAMERA MODULE

CROSS-REFERENCE TO RELATED APPLICATIONS

This application is a 35 U.S.C. § 371 national phase of PCT International Application No. PCT/EP2018/064074, filed May 29, 2018, which claims the benefit of priority under 35 U.S.C. § 119 to European Patent Application No. 17173379.3, filed May 30, 2017, the contents of which are incorporated herein by reference in their entirety.

FIELD OF THE INVENTION

The invention relates to a camera module for a motor vehicle, comprising at least one printed circuit board and a shield for enclosing the printed circuit board. The invention also relates to a method of using, and a method of assembling a camera module.

BACKGROUND

The packaging space for a camera module for monitoring the driver is highly limited and demands compact and space saving construction of the camera module. Another requirement by the manufacturers is the cost effectiveness of the camera module. Furthermore, the camera module itself or other electronic devices nearby may include sensitive electronic components, which may be disturbed in function by electromagnetic interference.

From WO 2013/002897 a device for a motor vehicle configured to process image data of an image capturing unit is known, which includes a housing and a plurality of printed circuit boards which are placed in parallel with a distance to each other within a housing. The housing provides the fixation of the printed circuit boards and additional features to ensure heat dissipation. The housing can be a metal housing. However, due to the plurality of functional details of the housing, the camera module would be expensive to manufacture with a metal housing. Thus, the housing is typically made of plastic and does not provide electromagnetic shielding. Furthermore, the assembling procedure is to be simplified.

The problem underlying the invention is to provide a camera module which has a compact design, is electromagnetically shielded, and cost effective to manufacture and to assemble.

This problem is solved by a camera module and an assembling method having the features described herein.

SUMMARY AND INTRODUCTORY DESCRIPTION OF PREFERRED EMBODIMENTS

According to the invention a camera module for a vehicle, in particular for driver monitoring, includes at least one printed circuit board and a shield for enclosing the printed circuit board. According to the inventive realization of the shield, the shield includes a first shielding part and a second shielding part, wherein the first shielding part is a ring shaped part and the second shielding part is a hat shaped part put over, enclosing, and contacting the first shielding part. Enclosing and contacting the first shielding part with a second shielding part provides the camera module with a reliable electromagnetic shielding, allows for space saving construction, and cost-effective manufacturing and assembly.

Preferably, the ring-shaped first shielding part encloses at least 210° of the at least one circuit board, more preferably, at least 270°, even more preferably at least 330°, and most preferably fully encloses the at least one circuit board to form a closed ring.

Preferably, the first shielding part and the second shielding part are connected to each other by one or more clip connectors. This embodiment is particularly cost effective and fast to assemble. When clip connectors are used no use need to be made of other fasteners to connect the first shielding part and the second shielding part. The second shielding part can be equipped with a clip connector or a set of clip connectors. The clip connectors can be distributed on the second shielding part so that a reliable and mechanical stable connection to the first shielding part can be achieved. The connection between the first shielding part and the second shielding part can be realized in a reversible manner, i.e., the clip connectors can be build such that the connections can be disconnected without damage.

Preferably, the at least one printed circuit board and the first shielding part are connected to each other by one or more clips. This embodiment as well is particularly cost effective and fast to assemble. When clips are used no use need to be made of other fasteners to assemble the at least one printed circuit board and the first shielding part. A clip or a set of clips can be arranged along the circumference of the at least one printed circuit board. The clips can be distributed along the first shielding part to ensure that the circumference of the at least one printed circuit board is contacted in such a way that the at least one printed circuit board is reliably connected to the first shielding part and mechanically stable. The connection between the at least one printed circuit board and the first shielding part can be realized in a reversible manner, i.e., the clips can be build such that the connections can be disconnected without damage.

In a preferred embodiment, the first shielding part and/or the second shielding part are made of punched and folded sheet metal. Sheet metal can be processed by punching and folding in a simple and cost effective manner, but is nevertheless able to provide sufficient shielding of electromagnetic rays. Through the punching and folding, the ring shape and the hat shape of the first and/or second shielding parts, respectively, can be easily generated. Advantageously, clips and/or clip connectors can be produced from the sheet metal with appropriate elasticity, such that no additional elements are required.

Preferably, electronic components of the camera module on the at least one printed circuit board are contained in a shielded space formed by the printed circuit boards, the first shielding part, and/or the second shielding part. Enclosing the electronic components in a shielded space provides a simply possibility to prevent electromagnetic fields from passing through the shield and to avoid any disturbance by or of any other devices.

In an advantageous embodiment, the camera module includes at least two printed circuit boards arranged in an overlapping manner. The possibility to mount at least two printed circuit boards in the camera module complies with the possibility of a particular compact and space-saving embodiment of the invention. The presence of at least two printed circuit boards allows making use of a multiple of the area of a single printed circuit board.

Advantageously, the at least two printed circuit boards are arranged in parallel, or essentially in parallel, and/or with a distance to each other. The parallel arrangement of the at least two printed circuit boards allows a compact and space-saving construction. Deviations from the parallel arrangement of the at least two printed circuit boards are not excluded. Essentially parallel means that the angle between each two of the printed circuit boards is less than or equal 45°, preferably less than or equal 30°, or even more preferred less than or equal 15°, ideally 0°. The at least two printed circuit boards are preferably arranged with a distance to each other in order to form an advantageous mounting space between them.

In an advantageous embodiment the at least two printed circuit boards have an equal shape, or an essentially equal shape. An equal shape of the at least two printed circuit boards allows a simple construction of the shield and in particular the first shielding part. Essentially equal means that small differences in the shapes of the at least two printed circuit boards, e.g., extensions, protrusions, gaps, cavities, or the like, are possible. It is not excluded that a plurality of printed circuit boards of different shape are used.

In a preferred embodiment, a gap is formed between the two end regions of the first shielding part in the mounted state, wherein the second shielding part covers the gap of the first shielding part in the mounted state. The first shielding part may be made from a sheet, e.g., by a metal sheet by folding. The folding process, however, implies that the first shielding part includes a gap in the folded state. By covering the gap of the first shielding part in the mounted state, the second shielding part ensures that the gap does not lead to a leakage in the electromagnetic shield.

Preferably, the camera module includes a housing surrounding the second shielding part. A housing can be made of a material other than an electrically conducting material without any influence of the shielding property of the camera module but with the advantage that the housing provides a highly adaptive mechanical interface to mount the camera module in a preferred manner, as well as protection of the components arranged inside the housing. The housing can for example be made of injection moulded plastic and be equipped with fasteners.

It is advantageous that the housing includes an opening for an electrical connector. The electrical connector allows for power supply or the transfer of the camera's images or data from image evaluation from or to other electronic devices of the vehicle, e.g., the body control module, driving assistance means, displays, or other on-board computers. Also the control of the camera can be coordinated with an electrical connector.

Preferably, the housing is adapted to be clipped over the second shielding part. The housing can include a clip or a set of clips to receive and stabilize mechanically the second shielding part with the first shielding part and/or with the at least one printed circuit board. This ensures mechanical stability of the camera module since the at least one printed circuit board is connected to the first shielding part and the first shielding part is connected to the second shielding part, which is connected to the housing. Other variations of connections are also possible.

Advantageously, the second shielding part includes a hole allowing light to enter into the camera module. The camera module can expediently contain a camera that is directed outwards the camera module. To ensure functionality the second shielding part includes a hole allowing light to enter the camera module's camera or the camera to pass through the second shielding part.

Preferably, the camera module is mounted by putting the second shielding part over the first shielding part, such that the second shielding part encloses and contacts the first shielding part. This assembling method is very fast and thus cost effective. Advantageously, the first shielding part and the second shielding part are manufactured by punching and folding sheet metal. Sheet metal is inexpensive and allows for simple generation of the ring shape of the first shielding part and the hat shape of the second shielding part by folding, while ensuring good electromagnetic shielding.

A preferred application of the inventive camera module is for driver monitoring in a motor vehicle. In this application, the camera module is arranged within the passenger compartment of the motor vehicle and directed towards a position where usually the face of the driver is present during driving. Other applications of the inventive camera module in a motor vehicle are possible, for example for capturing images of the surrounding of the motor vehicle.

BRIEF DESCRIPTION OF THE DRAWINGS

In the following the invention shall be illustrated on the basis of preferred embodiments with reference to the accompanying drawings, wherein.

DETAILED DESCRIPTION OF PREFERRED EMBODIMENTS

Figure 7:
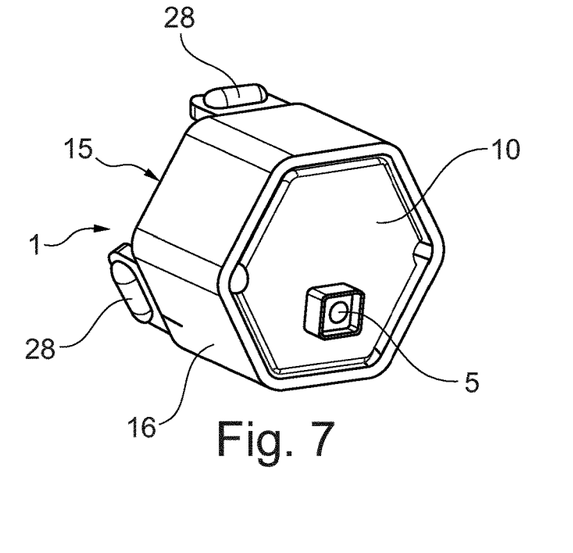
FIGS. 7 and 9 show perspective views of a camera module from different perspectives.
Figure 9:
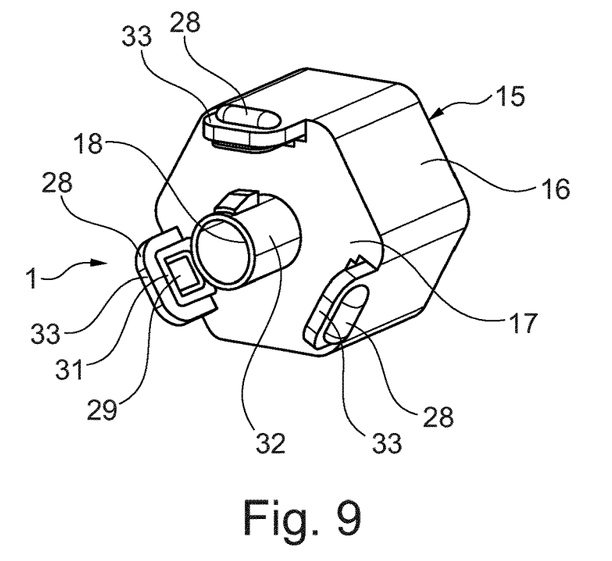
Figure 18:
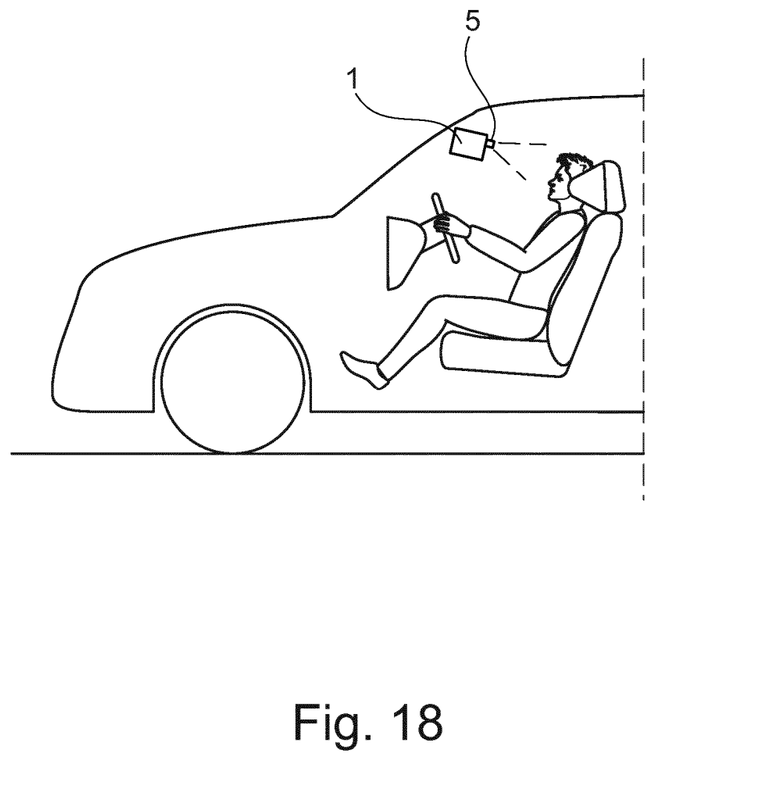
FIG. 18 shows a schematic view of a motor vehicle with mounted camera module.

The camera module 1 as shown in FIGS. 7 and 9 includes at least one printed circuit board 2, here for example two printed circuit boards 2a, 2b, a first shielding part 7, a second shielding part 10, a housing 15 and a camera 5. As shown in FIG. 18, the camera module 1 is mounted in a motor vehicle, in particular within the passenger compartment, and preferably directed to the driver's face as part of a driver drowsiness detection system or driver monitoring system.

Figure 1:
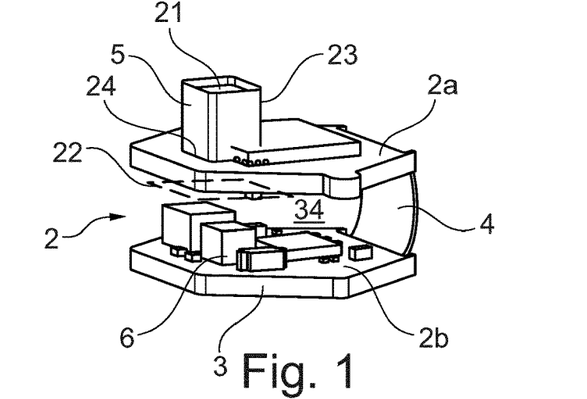
FIGS. 1 and 13 show perspective views of a plurality of printed circuit boards of the camera module from different perspectives.
Figure 13:
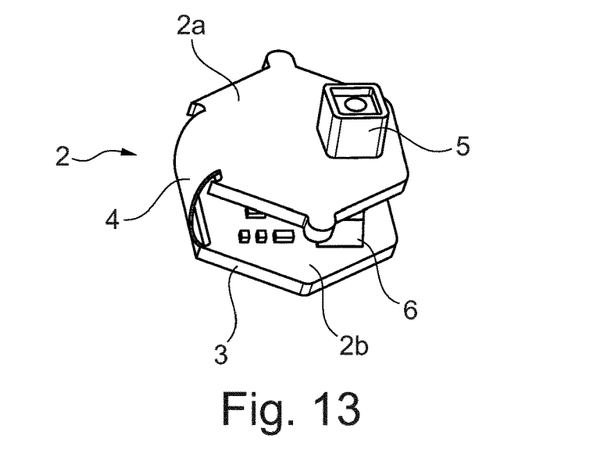
Figure 14:
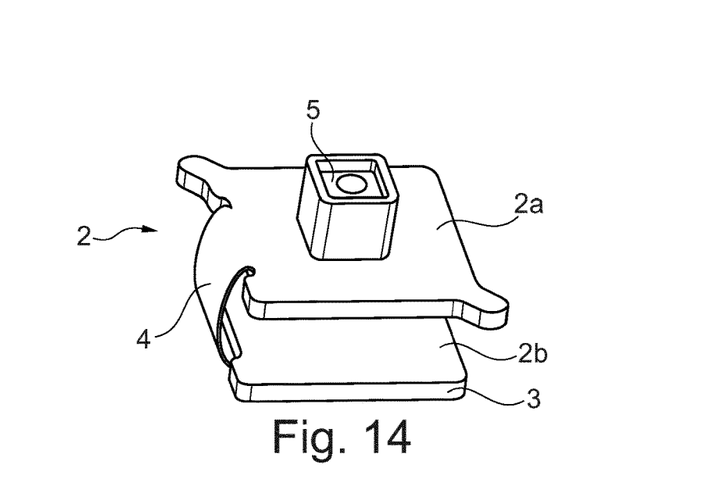
FIG. 14 shows an alternative embodiment of the plurality of the printed circuit boards of the camera module.

The printed circuit boards 2a, 2b which are shown in more detail in FIGS. 1, 13, and 14, include a first printed circuit board 2a and a second printed circuit board 2b. The at least one printed circuit board 2 has a circumference 3. The plurality of printed circuit boards 2a, 2b preferably have an equal shape. In the embodiment of FIGS. 1 to 13, the plurality of printed circuit boards 2a, 2b for example have a hexagonal shape. In the embodiment of FIGS. 14 to 17, the plurality of printed circuit boards 2a, 2b for example have a square shape. Other shapes are possible.

On one of the printed circuit board 2a the camera 5 is mounted. The camera 5 includes a lens objective 21 arranged to focus incident light on an image sensor 22, which is only schematically shown in FIG. 1, and which is adapted to convert incident light into an electrical signal containing the image information. The lens objective 21 is held in a lens holder 23. The printed circuit board 2a on which the camera is mounted preferably includes a through-hole 24 through which the lens holder 23 extends such that incident light can fall from one side of the printed circuit board 2a through the lens objective 21 and the through-hole 24 to the other side of the printed circuit board 2a where the image sensor 22 is arranged. Embodiments without through hole 24, where the lens objective 21 and the image sensor 21 are arranged on the same side of the printed circuit board 2a are possible. Electronic components 6 of the camera 5, in particular for controlling the camera 5, providing power supply and processing image data output by the image sensor 22 are mounted on the at least one printed circuit board 2a, 2b.

The plurality of printed circuit boards 2a, 2b is connected by a flexible printed circuit board connector 4. Other connections are possible, e.g., a wireless connection or other flexible or non-flexible connections. The electric connection between the at least two printed circuit boards 2a, 2b allow a connection between the electronic components 6 installed on the printed circuit boards. E.g., one printed circuit board 2a may include a camera 5 and the other printed circuit board 2b may include a connection unit to receive a connector 19 which will be explained later. The two printed circuit boards 2a, 2b include a non-conducting substrate, like a reinforced polymer, and electrical conductors.

Figure 2:
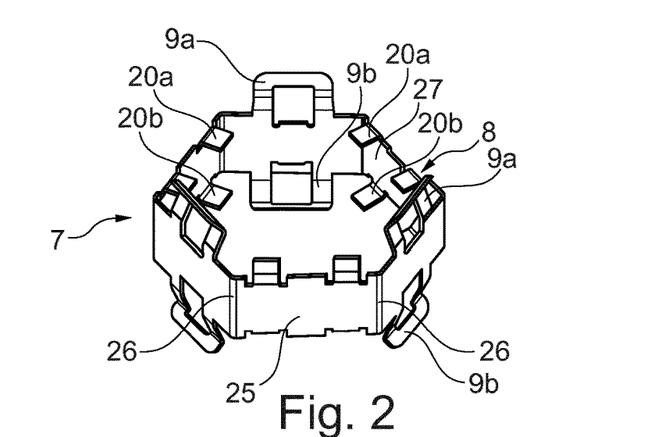
FIGS. 2 and 12 show perspective views of a first shielding part of the camera module from different perspectives.
Figure 12:
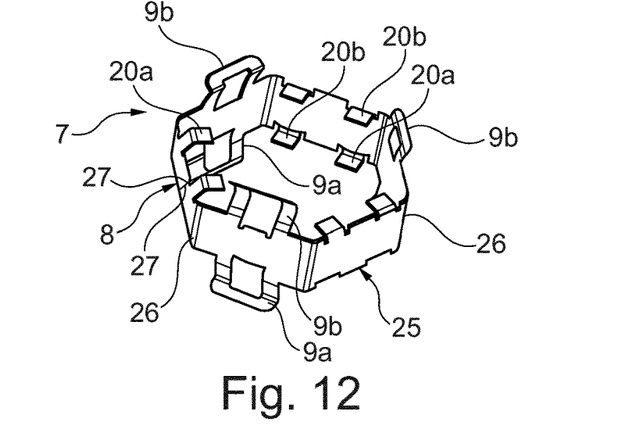
Figure 15:
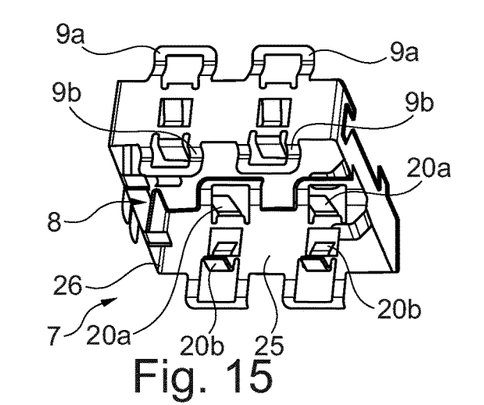
FIG. 15 shows an alternative embodiment of the first shielding part of the camera module.

The first shielding part 7, which is shown in detail in FIGS. 2, 12 and 15, includes a body part 25, clips 9a, 9b and protrusions 20a, 20b. The first shielding part 7 is adapted to be mountable along the circumference 3 of the at least one printed circuit board 2a, 2b. The body part 25 essentially has the form of a strip which is preferably folded along a plurality of edges 26 to form a closed ring as seen in FIGS. 2, 12, and 15. The body part 25 does not have to be folded along a plurality of edges 26, for example in the case of round, oval, or rounded printed circuit boards 2a, 2b.

Between the two ends 27 of the strip-shaped body part 25 a gap 8 is formed. The body part 25 can includes fasteners to fasten the two ends 27 of the body part 25 together. The two ends 27 of the strip-shaped body part 25 can overlap each other in order to enhance the shielding effect. Non-overlapping arrangements are possible, like in the embodiments shown in the FIGS. 2, 12, and 15.

The first shielding part 7 includes supports 20a, 20b to support the printed circuit boards 2a, 2b designed to be placed on the first shield part 7. In more detail, the first shielding part 7 includes first supports 20a distributed along one side of the ring shaped first shielding part 7 to support the first printed circuit board 2a and second supports 20b distributed along the other side of the ring shaped first shielding part 7 to support the second printed circuit board 2b. In the preferred embodiment of sheet metal for the body part 25, the supports 20a, 20b are advantageously formed by integral protrusions of the body part 25, as seen in FIGS. 2, 12 and 15.

The first shielding part 7 includes clips 9a, 9b to hold the printed circuit boards 2a, 2b firmly against the first shielding part 7. More particularly, the first shielding part 7 includes first clips 9a distributed along one side of the ring shaped first shielding part 7, for example between the first supports 20a in an alternating manner, to press the first printed circuit board 2a against the first supports 20a in the mounted state, and second clips 9b distributed along the other side of the ring shaped first shielding part 7, for example between the second supports 20b in an alternating manner, to press the second printed circuit board 2b against the second supports 20b in the mounted state. The clips 9a, 9b are preferably designed and positioned to exert an elastic force against the printed circuit boards 2a, 2b in the mounted state. Of course, the clips 9a, 9b can be provided on the at least one printed circuit board 2 instead of the first shielding part 7. Alternatively, cooperating clip parts can be provided on the at least one printed circuit board 2 and the first shielding part 7.

In this embodiment, the assembly of the plurality of printed circuit boards 2a, 2b and the first shielding part 7 is realized with the clips 9a, 9b only and without the need of other fasteners, e.g., screws, bolts, glue, or others.

The first shielding part 7 is advantageously made of sheet metal, which is cost-effective and easy to process due to its elastic properties, and allows forming of the elastic clips 9a, 9b and the protrusions 20a, 20b in an easy manner. The body part 25, the clips 9a, 9b and the protrusions 20a, 20b are preferably formed integrally as one part in particular of sheet metal. This one-part solution is very cost effective. As evident from FIGS. 1, 3, 13, 14, the printed circuit boards 2a, 2b are preferably arranged in a fully overlapping manner to each other. Partly overlapping or non-overlapping arrangements are also possible.

Figure 4:
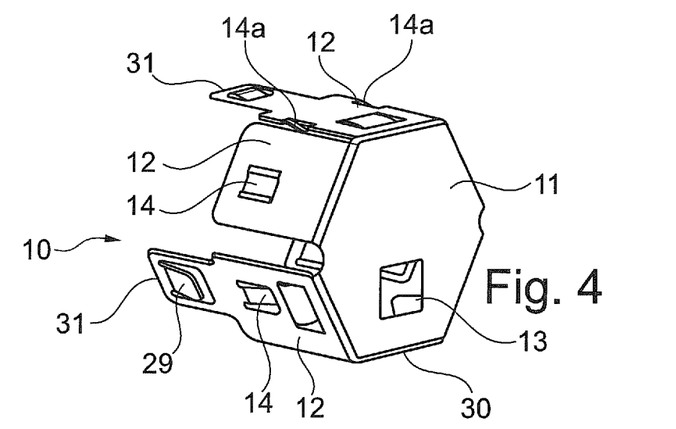
FIG. 4 shows a perspective view of a second shielding part of the camera module.
Figure 16:
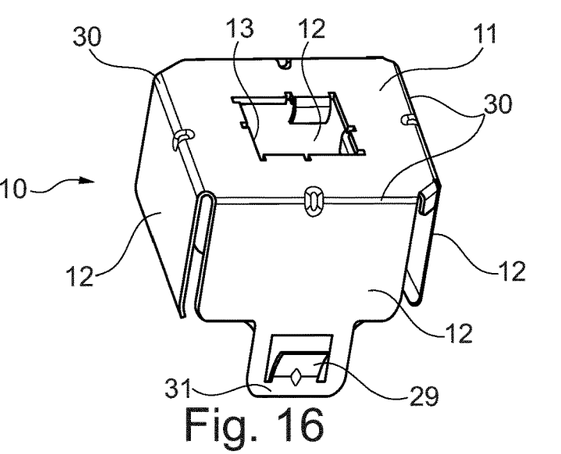
FIG. 16 shows an alternative embodiment of the second shielding part of the camera module.

The second shielding part 10, as shown in FIGS. 4 and 16, includes a top part 11, one or more side parts 12, a hole 13, clip connectors 14 and clip elements 29. Preferably, the top part 11 includes a plurality of edges 30, like six edges 30 in the embodiment of FIGS. 4 to 11, or four edges 30 in the embodiment of FIG. 16. Preferably, the second shielding part 10 includes a plurality of side parts 12, preferably at least three side parts 12, more preferably at least four side parts 12. In a preferred embodiment, a side part 12 is provided at each edge 30 of the top part 11, yielding for example six side parts 12 in the embodiment of FIGS. 4 to 11 and four side parts 12 in the embodiment of FIG. 16. As described above, the second shielding part 10 is preferably folded along a plurality of edges 30 to form a hat. The second shielding part 10 does not have to be folded along a plurality of edges, for example in the case of a round, oval, or rounded printed circuit boards 2a, 2b or first shielding part 7.

Figure 10:
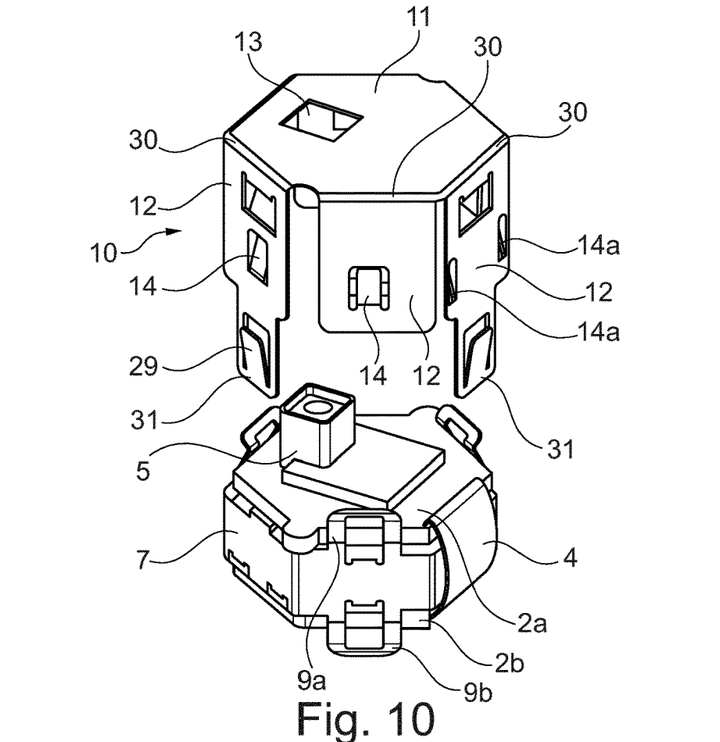
FIGS. 10 and 11 show perspective views of parts of the camera module in different assembly states for illustrating a method to assemble the camera module.

Each side part 12 is preferably folded along the corresponding edge 30 connecting it to the top part 11, thus forming a hat shaped second shielding part 10 as shown in FIGS. 4, 10 and 16. The shape of the second shielding part 10 is adapted to receive the mounted unit of the at least one printed circuit board 2a, 2b with the first shielding part 7, as shown for example in FIG. 3. The hat shape of the second shielding part 10 is given by the top part 11 and the one or more side parts 12. Preferably, the shape of top part 11 essentially coincides with the shape of the at least one printed circuit board 2a, 2b and the first shielding part 7. Even more preferably, the shape of the top part 11 coincides with the cross section of the second shielding part 10.

Figure 5:
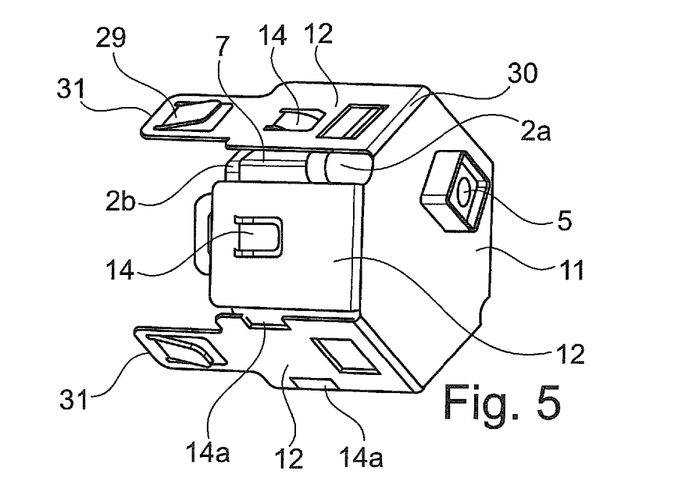
FIG. 5 shows the first shielding part and the plurality of printed circuit boards assembled to the second shielding part shown in FIG. 4.
Figure 11:
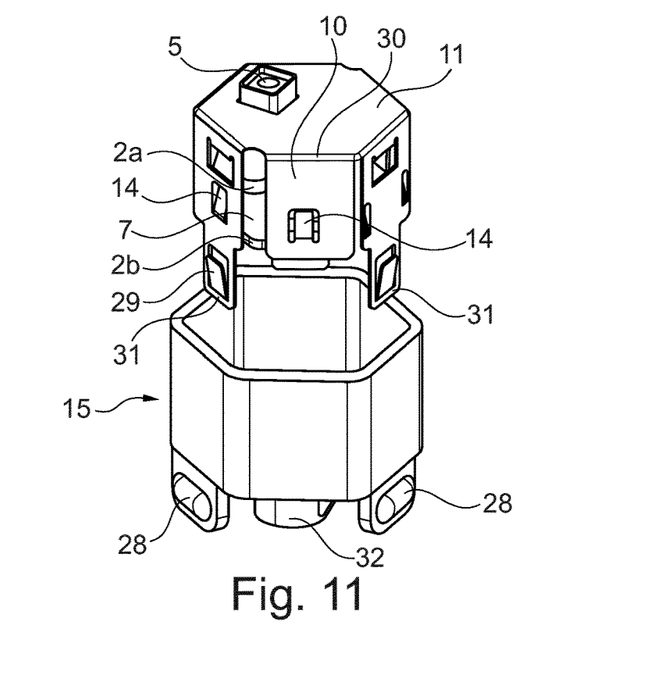

The second shielding part 10 includes a hole 13 allowing light to enter the camera module 1 and/or the camera 5, and/or allowing the lens objective 21 to extend through the hole 13, as shown for example in FIGS. 5, 7, 11. When the lens objective 21 extends through the hole 13 of the second shielding part 10, mechanical contact between the camera 5 and the second shielding part 10 can further stabilize the assembly.

The clip connectors 14 are adapted to fix the mounted unit of the at least one printed circuit board 2a, 2b and the first shielding part 7 within the second shielding part 10. In more detail, the clip connectors 14 are provided on, and distributed over, the one or more side parts 12 of the second shielding part 10. In particular, each side part 12 can have one or more clip connectors 14, as in the embodiments of FIGS. 4, 10, 16. In FIG. 10, for example, the side part 12 corresponding with the printed circuit board connector 4 includes two clip connectors 14a provided at the sides of the side part 12, whereas the other side parts 12 include one clip connector 14 positioned in a central area of the side part 12. Of course, the clip connectors 14 can be provided on the first shielding part 7 instead of the second shielding part 10. Alternatively, cooperating clip parts can be provided on the first shielding part 7 and the second shielding part 10.

The clip elements 29 are adapted to fix the position of the second shielding part 10 within the housing 15, which will be described later. In more detail, the clip elements 29 are provided on, and distributed over, the one or more side parts 12 of the second shielding part 10. In particular, each side part 12, or a sub-set of the side parts 12, can have one or more clip elements 29. In the embodiments of FIGS. 4, 10, 16, for example, every second side part 12 includes a clip element 29, which is positioned on a protrusion 31 provided at the free side of the corresponding side part 12. In the embodiment of FIGS. 4 and 10, for example, three side parts 12 have protrusions 31 with a clip element 29, whereas in FIG. 16, two opposing side parts 12 have protrusions 31 with a clip element 29.

Preferably, the second shielding part 10 is made of sheet metal, which is cost-effective and easy to process due to its elastic properties, and allows forming of the elastic clip connectors 14 and/or clip elements 29 in an easy manner. The top part 11, the one or more side parts 12, the clip connectors 14 and/or clip elements 29 are preferably formed integrally as one part in particular of sheet metal. This one-part solution is very cost effective.

Figure 8:
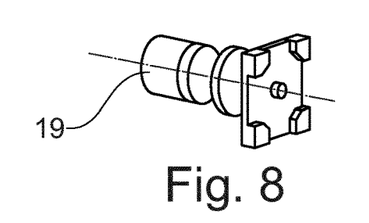
FIG. 8 shows an electrical connector of the camera module.

An electrical connector 19 is shown in FIG. 8. In this embodiment, the connector 19 can directly be mounted on the one of the printed circuit boards 2a, 2b, here the second printed circuit board 2b, and is adapted to receive for example a coaxial RF connector, preferably a sub miniature type B connector. Any other type of connection is also possible, e.g., wireless or other wired connections.

Figure 6:
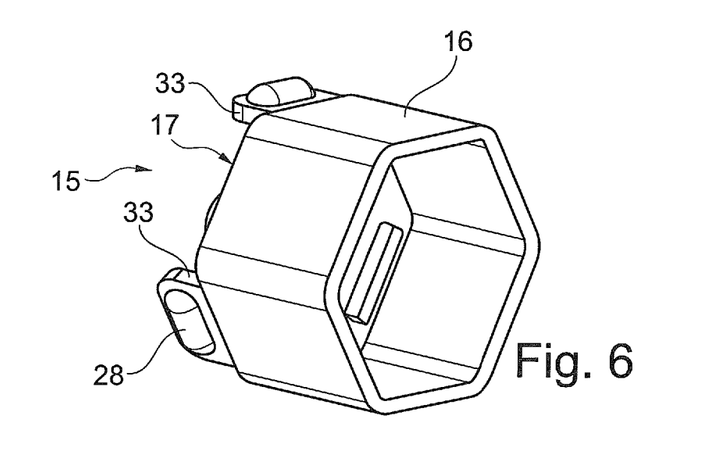
FIG. 6 shows a perspective view of a housing of the camera module.
Figure 17:
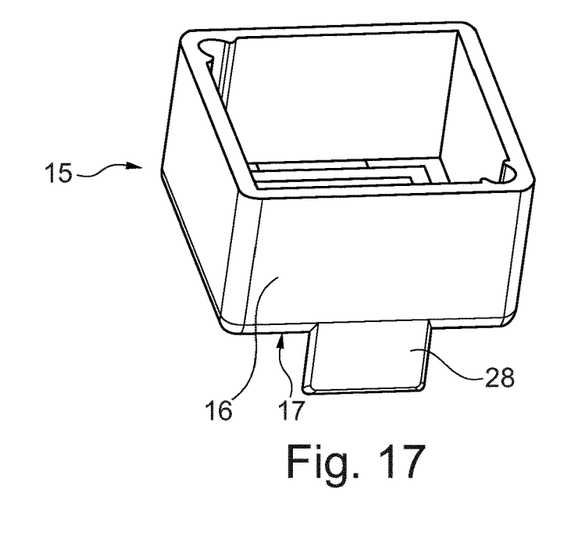
FIG. 17 shows an alternative embodiment of the housing of the camera module.

The housing 15 includes a circumferential wall 16, a face wall 17, an opening 18 for the electrical connector 19, and legs 33 as shown in FIGS. 6, 9 and 17. The hat shape of the housing 15 is formed by the circumferential wall 16 and the face wall 17. Preferably, the shape of face part 17 coincides essentially with the shape of the at least one printed circuit board 2a, 2b, the first shielding part 7, and/or the second shielding part 10. Even more preferably, the shape of the face wall 17 coincides with the cross section of the circumferential wall 16. Preferably, the housing 15 can be a molded, one-part plastic part, for which the manufacturing is particularly cost-effective.

The housing 15 includes an opening 18 for the electrical connector 19 that can be used to transfer data from/into to camera module 1 and/or provide electrical supply for the camera module 1. The opening 18 is preferably located in the face wall 17. The housing 15 preferably includes a tube 32 surrounding the opening 18 at the outside of the housing 15, and being provided for guiding and holding the electrical connector 19.

The housing 15 includes legs 33 which can be protrusions of the side walls 16 and be arranged for example at the edges of the face wall 17. Each leg 33 includes a counter element 28, for example a recess in the leg 33, designed to interact with the clip elements 29 of the second shielding part 10 in order to lock the second shielding part 10 within the housing 15. The legs 33 are preferably formed as protrusions extending from the face wall 17 to the outside of the housing 15. In the embodiments shown in FIGS. 6 and 17, the counter elements 28 are recesses in the legs 33, but can have other suited forms.

In the following the assembling process of the camera module 1 will be described in more detail.

The first shielding part 7 is formed by punching or cutting a suited piece of sheet metal from a web, and folding or bending the punched or cut piece of sheet metal along edges 26 to form the first shielding part 7 as shown in FIGS. 2, 12 and 15.

Figure 3:
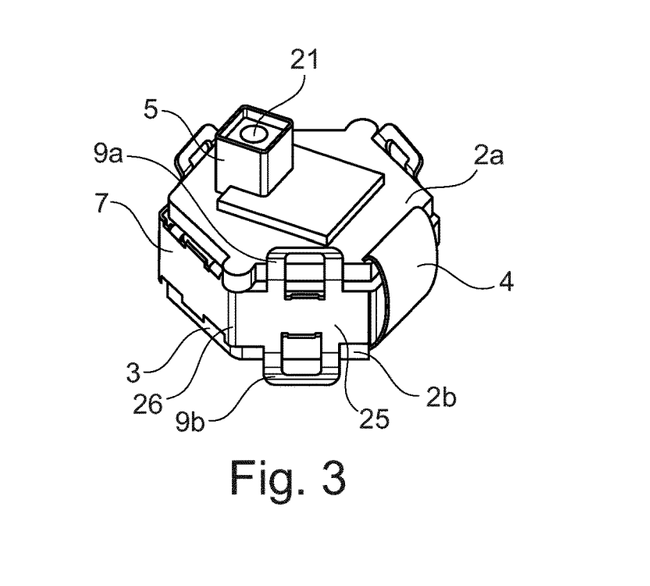
FIG. 3 shows a perspective view of the first shielding part assembled to the plurality of printed circuit boards of FIG. 1.

Then the first shielding part 7 is assembled with the at least one printed circuit board 2a, 2b. The first shielding part 7 is arranged along a part of the circumference 3 of the two printed circuit boards 2a, 2b. The two printed circuit boards 2a, 2b rest on the protrusions 20a, 20b and are fixed by the clips 9a, 9b to generate the mounted unit of printed circuit boards 2a, 2b and first shielding part 7 as shown in FIG. 3. The clips 9 and the protrusions 20 are arranged on the first shielding part 7 so that the at least one printed circuit board 2a, 2b is mechanically stabilized. A proper arrangement of the clips 9 ensures a stable assembly of the first shielding part 7 and the at least one printed circuit board 2a, 2b, irrespective of the shape of the at least one printed circuit board 2a, 2b.

The second shielding part 10 is formed by punching or cutting a suited piece of sheet metal from a web, and folding or bending the punched or cut piece of sheet metal along edges 30 to form the second shielding part 10 as shown in FIGS. 4 and 16.

As described above, the first shielding part 7 contacts the printed circuit boards 2a, 2b on the edge of the board 2a, 2b or on one side of the board 2. The first shielding part 7 fixates and positions the two printed circuit boards 2a, 2b together at a fixed distance from each other, as shown for example in FIG. 3. Preferably, the printed circuit boards 2a, 2b can be joined electrically with a board to board connector or by a flexible connector 4.

FIG. 10 shows the assembly of the first shielding part 7, which is already assembled with the at least one printed circuit board 2a, 2b, to the second shielding part 10. The mounted unit of first shielding part 7 and printed circuit boards 2a, 2b is inserted into the second shielding part 10 through the hat opening thereof, i.e., from the side opposite of the top part 11, with the camera 5 ahead, such that the hole 13 in the top part 11 of the second shielding part 10 receives the camera 5 that passes through the hole 13. The insertion process continues until the clip connectors 14 of the second shielding part 10 interact with the first shielding part 7, or corresponding clip parts thereof, in order to fix the first shielding part 7 within the second shielding part 10. This mounted state is shown in FIG. 5. In this embodiment, the mounted assembly of the plurality of printed circuit boards 2a, 2b, the first shielding part 7, and the second shielding part 10 is realized with clip connectors 14, only, without the need for other fasteners, e.g., screws, bolts, glue, or others.

In the assembly shown in FIG. 5, shielding of electromagnetic rays is accomplished. A plurality or all of the electronic components 6 are enclosed in a shielded space 34 formed between the printed circuit boards 2a, 2b, the first shielding part 7 and/or the second shielding part 10. The gap 8 in the first shielding part 7 is covered by the second shielding part 10, which ensures that the electronic components 6 are located within a shielded space 34 that forms a Faraday cage and no electromagnetic rays can pass through the gap 8. This ensures that the electronic components 6 cannot disturb, and/or be disturbed by, nearby electronic devices. Nevertheless, the gap 8 allows for easy and cost-effective manufacturing. In this embodiment, the electronic components 6 are arranged between the two printed circuit boards 2a, 2b to ensure an effective shielding of the electronic components of the camera module 1 in the mounted state.

As described above, in the embodiments shown in the Figures two punched metal parts 7, 10 form an electromagnetic shield due to contact between them. The second shielding part 10 encloses the printed circuit boards 2a, 2b and contacts the first shielding part 7 in order to complete the shielding, bridging the gap 8 of the first shielding part 7. The sensitive components on the printed circuit board 2a, 2b are located inside the shielding parts 7, 10, except for the image sensor 22 and/or the electrical connector 19 which can be arranged outside the shielding parts 7, 10. The first and second shielding parts 7, 10 fixate the printed circuit boards 2a, 2b in the housing 15 without the need for additional fasteners such as screws. The plastic housing 15 enables integration of connector features and fastening features towards the car.

FIG. 11 illustrates the assembly of the second shielding as shown in FIG. 5 to the housing 15. The mounted unit of second shielding part 10 as shown in FIG. 5 is inserted into the housing 15 through the hat opening thereof, i.e. from the side opposite of the face wall 17, with the open side of the second shielding part 10 ahead, such that the top part 11 of the second shielding part 10 and the face wall 17 of the housing 15 oppose each other in the mounted state, forming the shielded space 34 between them. Preferably, therefore, the opening 18 for the electrical connector 19 and the hole 13 for the camera 5 are arranged opposite each other. The insertion process continues until the clip elements 29 of the second shielding part 10 interact with the counter elements 28 of the housing 15, in order to fix the second shielding part 10 within the housing 15. This mounted state is shown in FIGS. 7 and 9. In this embodiment, the assembly of the second shielding part 10 and the housing 15 is realized with the clip connectors 14b and the counter elements 28 only and without the need of other fasteners, e.g., screws, bolts, glue, or others.

The embodiments of FIGS. 1 to 13 show a hexagonal shape of the camera module 1, which can be advantageous in order to be able to fit near sloped walls in a car and still have enough PCB area for electrical components. In this embodiment, support from clips 9, clip connectors 14 and/or clip elements 29 on three sides, respectively, make the whole unit stable. The embodiments of FIGS. 14 to 17 show a rectangular or square shape of the camera module 1. Other geometrical shapes are possible.

While the above description constitutes the preferred embodiment of the present invention, it will be appreciated that the invention is susceptible to modification, variation and change without departing from the proper scope and fair meaning of the accompanying claims.

The invention claimed is:

1. A camera module for a motor vehicle for driver monitoring in a passenger compartment of the motor vehicle, comprising at least one printed circuit board and a shield for enclosing the printed circuit board, the shield comprises at least a first shielding part and a second shielding part, wherein the first shielding part is a ring shaped part such that the first shielding part includes an essentially strip-shaped body part mountable along the circumference of the at least one printed circuit board and the second shielding part is a hat shaped part such that the second shielding part includes a top part and one or more side parts enclosing the strip shaped body part of the first shielding part, wherein the second shielding part encloses, and contacts the first shielding part in a mounted state of the first and second shielding parts, and wherein the camera module further includes a housing surrounding the second shielding part and being mechanically connected to the second shielding part.

2. The camera module according to claim 1 further comprising in that the first shielding and the second shielding part are connected to each other by one or more clip connectors.

3. The camera module according to claim 1 further comprising in that the at least one printed circuit board and the first shielding part are connected to each other by one or more clips.

4. The camera module according to claim 1 further comprising in that the first shielding part or the second shielding part is made of sheet metal.

5. The camera module according to claim 1 further comprising in that electronic components on the at least one printed circuit board are contained in a shielded space formed by the at least one printed circuit board, the first shielding part or the second shielding part.

6. The camera module according to claim 1 further comprising in that the camera module comprises at least two of the printed circuit boards arranged in an overlapping manner to each other in one of, in parallel, essentially in parallel, or with a distance to each other.

7. The camera module for a motor vehicle according to claim 6 further comprising in that the at least two printed circuit boards have an equal shape, or an essentially equal shape.

8. The camera module according to claim 1 further comprising in that a gap is formed between two end regions of the first shielding part in the mounted state, wherein the second shielding part covers the gap of the first shielding part in the mounted state.

9. The camera module according to claim 1 wherein the housing comprises an opening for an electrical connector.

10. The camera module according to claim 1 further comprising in that the housing is adapted to be clipped over the second shielding part.

11. The camera module according to claim 1 wherein the second shielding part comprises a hole allowing light to enter into the camera module.

12. A method of using a camera module as claimed in claim 1 for driver monitoring in the passenger compartment of the motor vehicle.

13. A method of assembling a camera module as claimed in claim 1 comprising the step of putting the second shielding part over the first shielding part, such that the second shielding part encloses and contacts the first shielding part.

14. The method as claimed in claim 13 further comprising in that the first shielding part and the second shielding part are manufactured by punching and folding sheet metal.

15. The camera module according to claim 1, wherein the ring-shaped first shielding part encloses at least 210° of the at least one circuit board.

* * * * *